United States Patent
Yang et al.

(10) Patent No.: US 7,403,032 B2
(45) Date of Patent: Jul. 22, 2008

(54) TUNNELING DIODE LOGIC IC USING CML-TYPE INPUT DRIVING CIRCUIT CONFIGURATION AND MONOSTABLE BISTABLE TRANSITION LOGIC ELEMENT (MOBILE)

(75) Inventors: Kyoung Hoon Yang, Daejeon (KR); Sun Kyu Choi, Daejeon (KR)

(73) Assignee: Korea Advanced Institute of Scientififc and Technology, Daejeon (KR)

( * ) Notice: Subject to any disclaimer, the term of this patent is extended or adjusted under 35 U.S.C. 154(b) by 164 days.

(21) Appl. No.: 11/153,138

(22) Filed: Jun. 15, 2005

(65) Prior Publication Data

US 2006/0132168 A1    Jun. 22, 2006

(30) Foreign Application Priority Data

Dec. 22, 2004   (KR) .................... 10-2004-0110360

(51) Int. Cl.
  *H03K 19/195* (2006.01)
(52) U.S. Cl. ................. 326/6; 326/134; 326/135; 327/570
(58) Field of Classification Search ......... 326/125, 326/127, 132–135, 6; 327/499, 568, 570; 716/1
See application file for complete search history.

(56) References Cited

U.S. PATENT DOCUMENTS 5,313,117 A * 5/1994 Maezawa .................... 326/134

6,693,464 B2 * 2/2004 Cojocaru .................... 326/127
2003/0085736 A1 * 5/2003 Tinsley et al. ............... 326/81
2003/0231031 A1 * 12/2003 Cojocaru .................... 326/127

FOREIGN PATENT DOCUMENTS

EP       361508 A * 4/1990    ........... 650/96.14

* cited by examiner

Primary Examiner—Rexford Barnie
Assistant Examiner—Crystal L Hammond
(74) Attorney, Agent, or Firm—Harness, Dickey & Pierce, PLC

(57) ABSTRACT

The present invention relates to CML(Current Mode Logic)-type input driving method and tunneling diode logic using MOBILE(Monostable Nistable transition Logic Element) configuration, as kinds of very high-speed digital logic circuits.

The objectives of the present invention are to improve the disadvantage of MOBILE circuit configuration that is an existing tunneling diode logic, and at the same time provide new MOBILE based logic functions. Wherein, the difficulty for input voltage adjustment is resolved by replacing the input part with a CML input driving gate, and speed problem due to transistor is resolved. Moreover, a plurality of logic functions such as inverted return-to-zero D flip-flop, non-inverted return-to-zero D flip-flop, return-to-zero OR gate, return-to-zero D flip-flop generating differential output, and optical flip-flop are implemented.

9 Claims, 15 Drawing Sheets

TUNNELING DIODE LOGIC IC USING CML-TYPE INPUT DRIVING CIRCUIT CONFIGURATION AND MONOSTABLE BISTABLE TRANSITION LOGIC ELEMENT (MOBILE)

TECHNICAL FIELD

The present invention relates to high-speed logic gate used to high-speed communications(optical, wired and wireless).

Recently, with the rapid increment of the demand for wideband communication services, high-speed communications system capable of delivering more diverse and greater amount of information in a short time are required, thereby it is essential to develop high-speed digital ICs which is the key block of the communication systems.

BACKGROUND ART

As prior arts with respect to developing high-speed ICs, high-speed digital logic gates have been developed with ECL (Emitter Coupled Logic), CML(Current Mode Logic), and SCFL(Source Coupled Logic) circuit configurations using GaAs or InP based high-speed devices, HBT(Heterojunction Bipolar Transistor) or HEMT(High Electron Mobility Transistor).

Since however these technologies use feedback loop, circuit configuration is complex and the number of the device count is large, thereby have disadvantages of limiting operational speed of circuit and increasing power consumption.

Recently, with a view to complementing these disadvantages on existing circuits, the digital gates using tunneling devices with negative resistance characteristics have been attracted a great deal of interests. A tunneling diode is a device utilizing quantum effect in Nano-scale, has very fast switching speed, and has negative resistance characteristics in low applied voltage.

FIG. 1 shows current-voltage characteristics of tunneling diode, characterized in that in accordance with the increment of supply voltage from 0-V, current also increases; when supply voltage reaches the peak voltage(Vp) value, current also becomes to reach the peak current value;

and at this state, negative resistance characteristics appears in accordance with additional increment of voltage.

By using this negative resistance characteristics, a logic gate that does not use feedback loop and has much smaller device count than existing circuit device can be implemented. This characteristics together with high-speed switching characteristics of tunneling diode enable high-speed digital gate to be realized.

A representative example among logics utilizing existing tunneling diode is Monostable Bistable Transition Logic Element(MOBILE). Prior publications are as follows;

1. U.S. Pat. No. 5,313,117, "Semiconductor logic circuit using two N-type negative resistance device".

2. IEEE Electron Device Letters, vol.16, no.2, February 1995, "Monolithic Integration of Resonant Tunneling Diode and FET's for Monostable-Bistable Transition Logic Elements".

FIG. 2 shows a MOBILE(Monostable Bistable Transition Logic Element) circuit configuration. A load RTD(Resonant Tunneling Diode) (111) and a driver RTD (112) are connected in a series circuit, and a transistor (113) for current control is connected to a driver RTD (111) in a parallel circuit. A clock voltage is supplied to a load RTD (111), and an output is obtained at the point that a driver RTD (111), a load RTD (112), and drain (collector) of a transistor (111) are interconnected.

FIG. 3 shows the operational principle of MOBILE through load line analysis. When clock voltage is in 'LOW' state, the stable point of output voltage is decided in a single logic 'LOW' state. When clock voltage is more than two times bigger than the peak voltage of RTD, the stable points are in two logic states, logic 'LOW' and logic 'HIGH'. The change of logic state is decided according to the state of input voltage in the moment when clock voltage is changed from logic 'LOW' to logic 'HIGH'. When the sum (211) of the current flows at a transistor(115) and the peak current of driver RTD (112) is less than the peak current of load RTD(111) owing to logic 'LOW' of input voltage, output voltage becomes logic 'LOW' state. When the sum (211) of the current flows at a transistor(115) and the peak current of driver RTD(112) is more than the peak current of load RTD(111) owing to logic 'HIGH' of input voltage, output voltage becomes logic 'HIGH' state.

In the state that clock voltage is in logic 'HIGH', output voltage is not changed according to input voltage. The circuit operation as described in the above indicates inverted return-to-zero(RZ) D flip-flop operation. MOBILE circuit configuration as described in the above can be used for implementing an IC function with a reduced number of devices, thereby is capable of operating at high-speed with low power consumption.

DISCLOSURE

[Technical Problem]

However, prior arts described in the above have following problems. If it is said that the part controlling the current transmitted according to input voltage except for RTD is input driving circuit, existing input driving circuit configuration has been constructed as common-emitter mode(common source) comprising a single transistor(115). Here, transistor is commonly called for all 3-terminal switching devices including FET and BJT. Hereinafter, the followings are described on the basis of common-emitter mode.

FIG. 4 indicates the current intensity transmitted in input driving circuit in accordance with input voltage. As shown in FIG. 4, the current is abruptly increased at the moment when input voltage gets over the turn-on voltage in common-emitter. Even though one can connect a resistor to base or emitter in order to prevent this henomenon, this configuration severely degrades the operational speed performance characteristics of common-emitter, and thus it is not used. The abrupt increment of current according to input voltage causes the following problems.

At first, when we designed the MOBILE, the current of input driver should be accurately adjusted to be coincident with the operational principle of MOBILE(Monostable Bistable Transition Logic Element) circuit. Since therefore, the current is sensitively influenced on input voltage, it is difficult to accurately adjust the current in accordance with input voltage. Moreover, since turn-on voltage is not uniformly maintained owing to the limitation of device fabrication technology, it has difficulty in determining accurate input voltage for each transistor of the circuit. If the current flows at a transistor(115) is small in time that input voltage is supplied due that input voltage is not accurately adjusted, output does not vary in accordance with input. If the current flows at a transistor(115) is exceptionally large, flip-flop operation(output voltage is not altered in accordance with input voltage in 'HIGH' state for clock voltage)failed.

FIG. 5 shows load lines in the case that the current flows at the transistor exceptionally becomes large. As shown in FIG. 5, the stable point is a single logic 'LOW' state, and thus flip-flop fails in operation because output voltage can become to change into logic 'LOW' state. Unexpected excessive current also influences on the stability of transistor. Tunneling diode having negative resistance characteristics at low voltage(less than 0.4 V) for low power consumption is also used, thereby output voltage is also in low level(0-0.8V), and thus the transistor(115) connected to output port can not guarantee enough collector-emitter voltage to be operated in an active regime. This causes the operation speed of a transistor(115) to be declined, thereby the speed of overall IC to be limited.

Finally, existing MOBILE could not show a variety of logic operations except for inverted return-to-zero D flip-flop. A variety of logic circuits should be developed for being utilized to digital logic circuits applied to high-speed communication systems.

[Technical Solution]

The present invention is proposed for resolving the problems of the above prior arts, and the objectives of the present invention are to resolve the difficulty on input voltage adjustment, improve overall IC speed by making the transistor operated at bias voltage in which the transistor is operated at the highest speed, let the output voltage of the previous MOBILE circuit stage supplied to the input voltage of the next MOBILE circuit stage without use of additional device by making output voltage level be equal to input voltage level, and provide compatibility with existing high-speed circuits (ECL, CML, SCFL). Moreover, it is an objective to provide a variety of logic circuits(non inverted return-to-zero D flip-flop, inverted return-to-zero D flip-flop, return-to-zero NOR gate, return-to-zero OR gate, differential output voltage return-to-zero D flip-flop) and various kinds of optical flip-flops performing logic functions by additionally accepting optical signals as input signals.

As a subject-matter for achieving the above objectives in accordance with the present invention, the present invention proposes a MOBILE in which input driving circuit is CML (Current Mode Logic)-type. Here, CML logic includes SCFL-type logic based on FET as well as a logic-type based on generally known as a BJT. There are two input ports in CML, which can be configured to supply reference voltage (Vref) to one port and input voltage to the other port, or supply differential voltages to two input ports.

Subsequently, a kind of current source is connected to emitter of input transistor. By adjusting the amount of reference voltage(Vref) and input voltage, output voltage level and input voltage level can be the same. Thus, it is possible to configure to connect a plurality of logic stages. By changing the positions of reference voltage port and input voltage port according to desired logic operations, inverted return-to-zero D flip-flop or non-inverted return-to-zero D flip-flop operation can be achieved. Moreover, with a view to implementing the operations of new logic gates such as return-to-zero NOR gate or return-to-zero OR gate, additional N numbers of transistors can be connected to input transistors in a parallel. For optical signal processing in the above logic gate, one of input transistors of CML gate is replaced with a photo transistor.

Here, photo transistor is commonly called for all (2-terminal or 3-terminal structure) photo transistors which receive optical signals, and amplify the optical signals and convert the optical signals to electrical signals.

[Advantageous Effects]

As described in the above, the present invention provides a plurality of advantages for digital logic gates. The advantageous effects are as follows.

1) The problem related to the adjustment of input voltage, which was a problem in existing MOBILE, is resolved. The previously described problem(if voltage is not accurately adjusted, operation of flip-flop fails) occurs in prior arts owing to abrupt increment of the current flows at a-transistor (115) in accordance with the increment of input voltage. However, in the present invention, the maximum current heading out from output port to input driving circuit is decided as Iee by using CML gate. Thus, it is not necessary to adapt accurately input voltage to unintentional device characteristics, as is in existing MOBILE method.

2) By utilizing CML gate as input driving circuit, compatibility with existing logic gates(CML, ECL, SCFL, etc.) is improved. The logic circuit sequentially processing signals can be configured by being able to apply the output of logic circuit to the input of the next stage logic circuit without additional devices by adjusting reference voltage(Vref).

3) Since transistors of CML gate operate in bias condition operating at maximum speed, the overall speed of the circuit is improved.

4) A plurality of functions can be implemented by using the switching characteristics of CML gate. That is, by exchanging input ports, inverted return-to-zero D flip-flop and non-inverted return-to-zero D flip-flop can be implemented. Return-to-zero OR gate and return-to-zero NOR gate can be implemented with an additional transistor.

5) By connecting same series tunneling circuits to the input ports, differential voltage can be obtained simultaneously from a single input, thereby the complexity of the circuit can be reduced and the compatibility with existing circuits (ECL, SCFL, CML) can be improved.

6) By replacing input transistor with photo transistor, high-speed optical signal processing logic gates such as optical non-inverted return-to-zero D flip-flop, optical inverted return-to-zero D flip-flop, optical return-to-zero OR gate, and optical return-to-zero NOR gate can be implemented.

DESCRIPTION OF THE NUMERALS ON THE MAIN PARTS OF THE DRAWINGS

Figure 1:
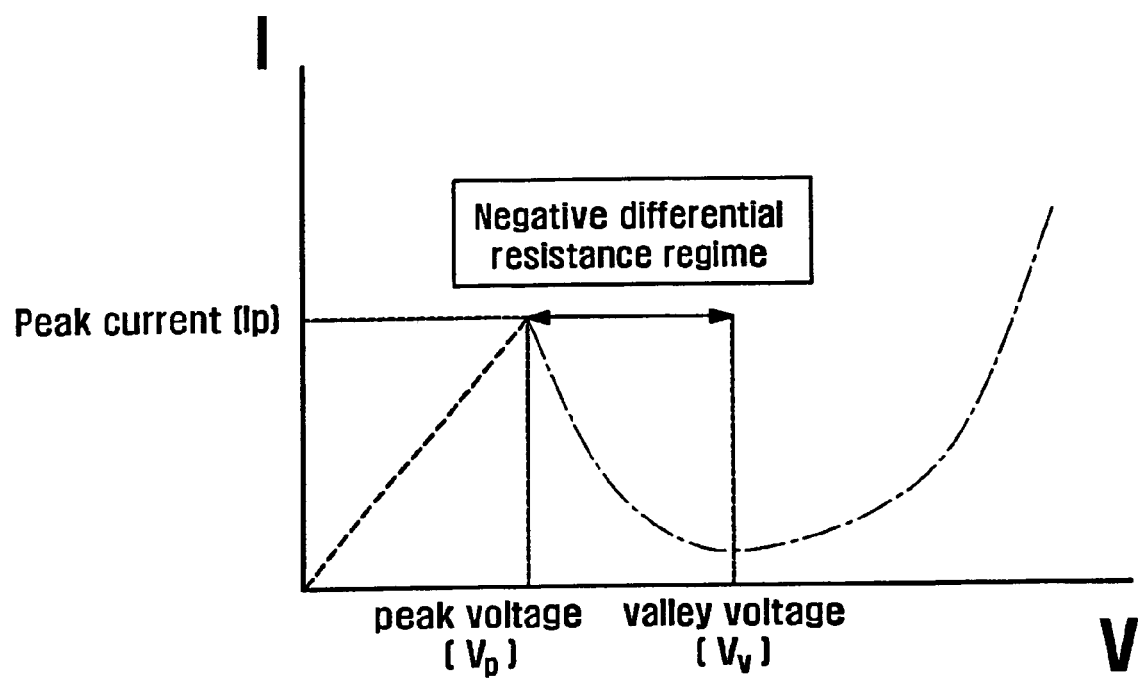
FIG. 1 is a brief DC I-V characteristics of tunneling diode.
Figure 2:
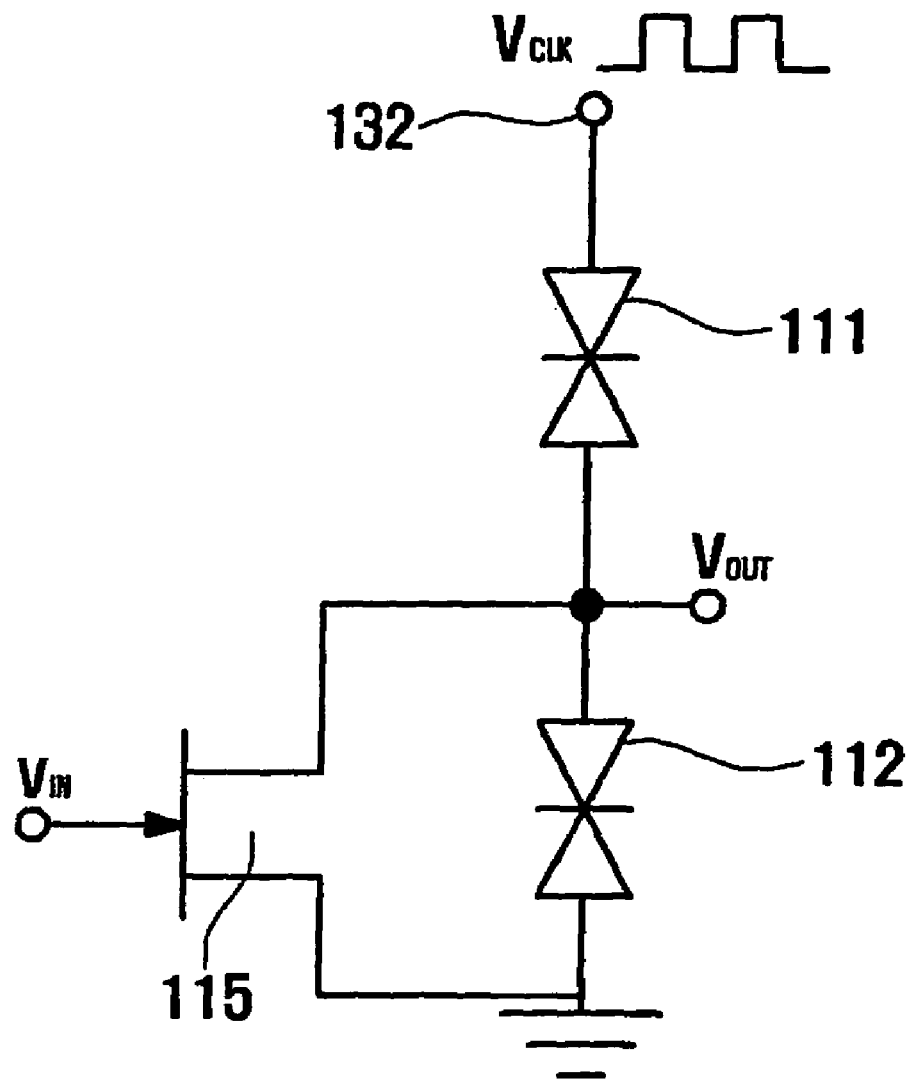
FIG. 2 is a circuit configuration diagram of inverted return-to-zero D flip-flop using existing MOBILE circuit.
Figure 3A:
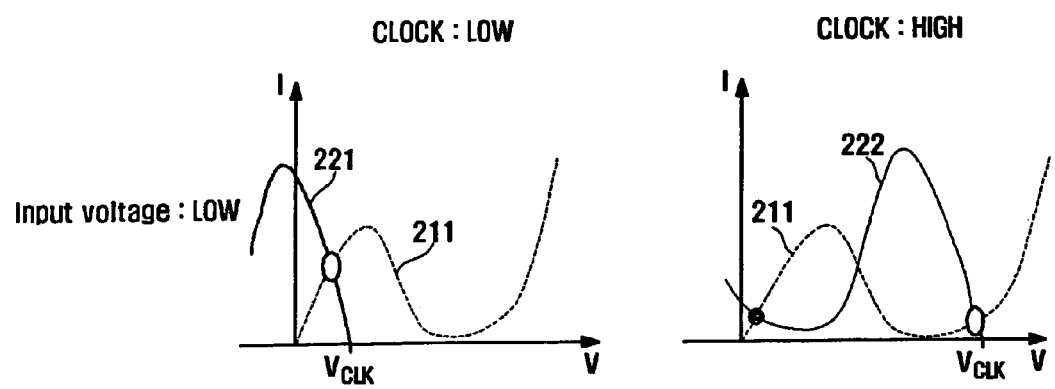
FIGS. 3a and 3b are views illustrating operational principle of existing MOBILE.
Figure 3B:
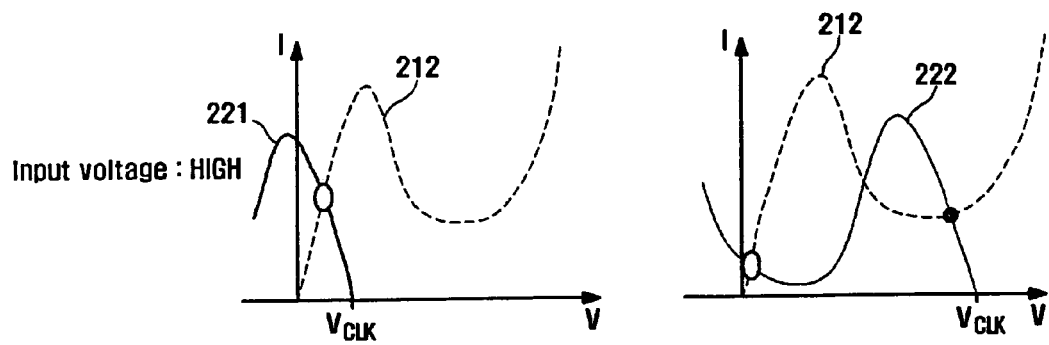
Figure 4:
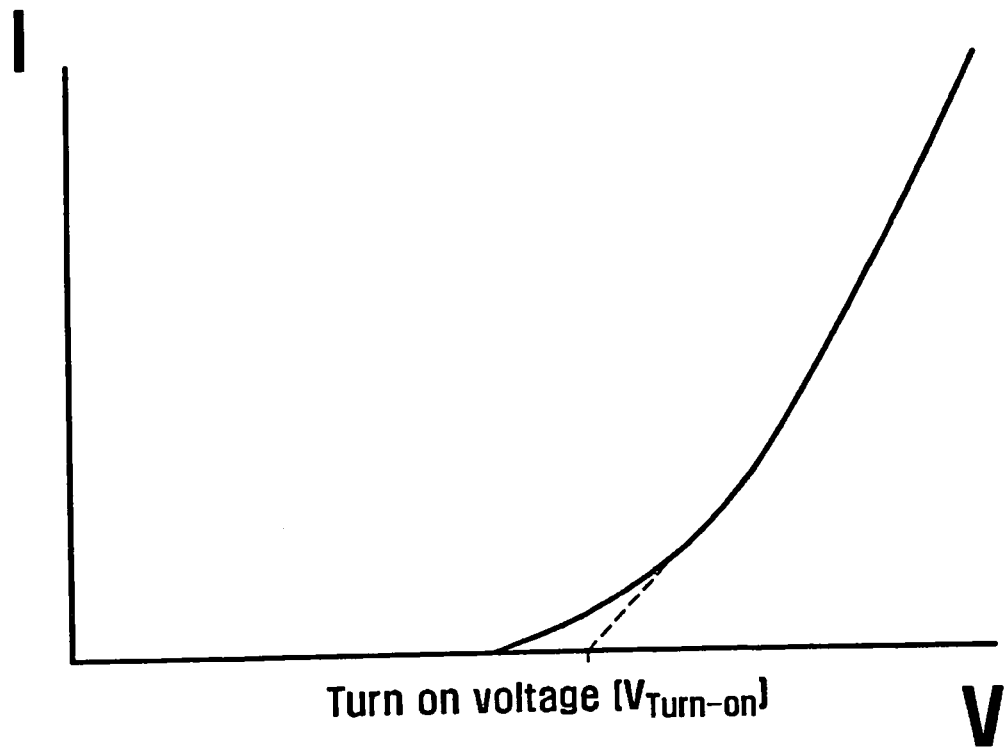
FIG. 4 is a current characteristics in accordance with input voltage of the switching device configured with a single transistor used in existing MOBILE.
Figure 5:
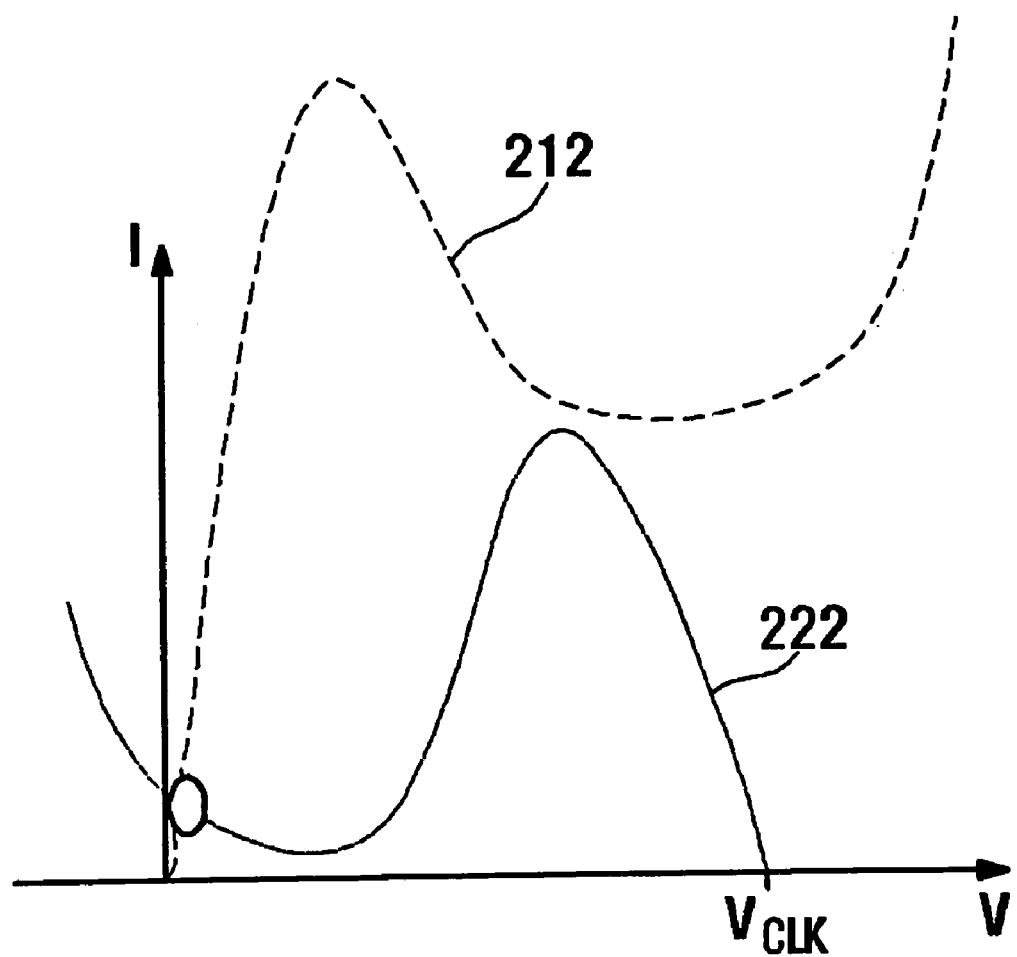
FIG. 5 is a load line characteristics when excessive current is flows at input transistor in existing MOBILE.

111: load RTD
112: driver RTD
113, 114, 115, 116: transistor
117: photo transistor
141 current source
121, 123: input port
122: reference voltage port
131: bias port
132: clock port
133: output port
134: inverted output port
211: current flows at driver RTD in accordance with output voltage
212: sum of the current flows at driver RTD in accordance with output voltage and the current flows at collector of a transistor
221: the current flows at load RTD in accordance with output voltage when clock voltage is in 'LOW' state
223: current flows at collector of HBT(114) configuring CML gate
224: current flows at collector of HBT(113) configuring CML gate
311: CML gate

MODE FOR INVENTION

Hereinafter, referring to appended drawings, the structures and operation principles for the embodiments of present invention are described in detail.

The present invention can be applied to basic technologies of all the 3-terminal switching devices including BJT and FET, which hereinafter, will be explained with the basis of high-speed HBT among BJT. The present invention can also be applied to all the tunneling diode technologies, which hereinafter, will be explained with the basis of InP based RTD having low peak voltage(Vp) and high PVCR(peak to valley current ratio).

Figure 6:
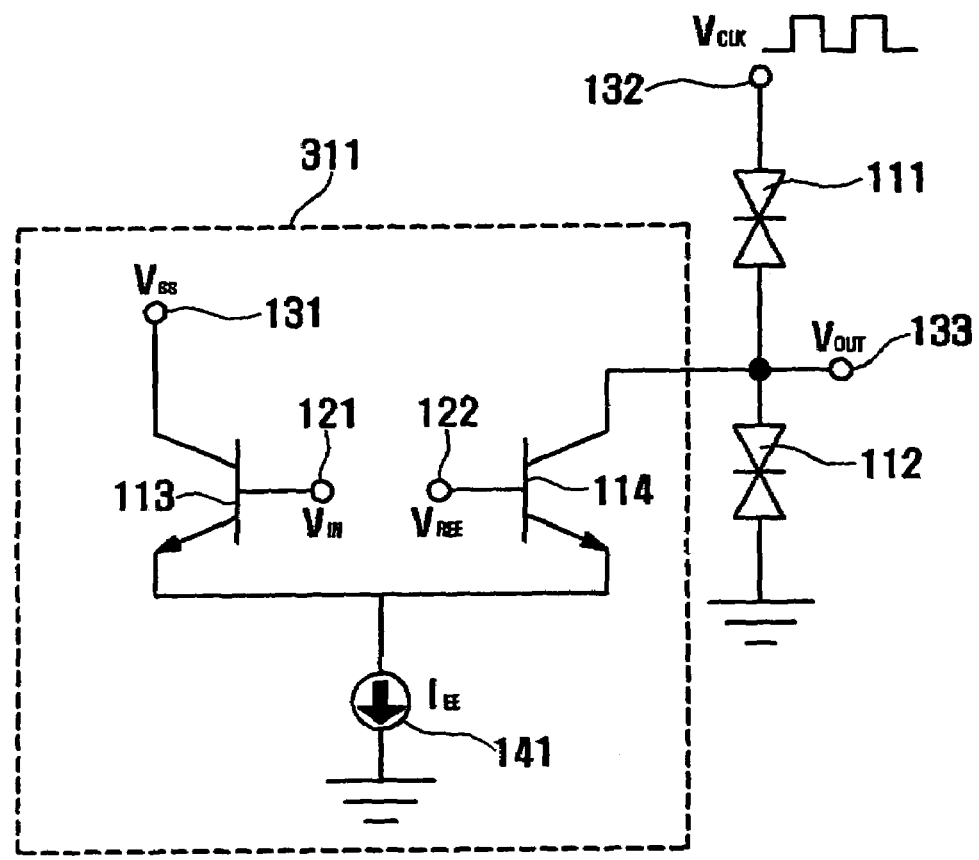
FIG. 6 is a circuit configuration diagram for a non-inverted return-to-zero D flip-flop configured with RTD logic gate using CML-type input driving circuit configuration and MOBILE proposed in the present invention.

FIG. 6 is a circuit configuration diagram for a non-inverted return-to-zero D flip-flop configured with RTD logic gate using CML-type input driving circuit configuration and MOBILE proposed in the present invention. As shown in FIG. 6, two tunneling diodes are connected in a series. Driver RTD(112) is connected to ground and load RTD(111) is connected to clock voltage port(132). A rectangular or sine wave oscillating with the regular period of a required frequency is supplied as clock voltage, and the clock voltage level is more than two times of RTD peak voltage. The joint point between Load RTD(111) and driver RTD(112) becomes output port (133). As being different from existing MOBILE circuit, CML gate(311) is used for input driving circuit. Here, CML gate is commonly called for the logics switching with only special amount of current, and includes a source coupled FET logic etc. based on FET. The collector of a transistor(114) among transistors configuring CML gate is connected to output port(133). In CML gate, two transistors commonly use a single emitter, and each base becomes to receive input voltage and reference voltage(Vref), respectively. In a non-inverted return-to-zero D flip-flop, the base of one transistor(121) becomes input port(121), and the base of the other transistor (114) becomes reference voltage port(122). The collector of a transistor(113) is connected to bias port(131), and the voltage for operating HBT in an active regime is supplied to the bias port. The current source(141) flowing constant current Iee is connected to emitter of transistors(113, 114). At this time, the current source is configured for being able to operate HBT (113, 114) in an active regime. The current source is configured with a resistor or a transistor. At this time, the intensity of current Iee which makes current source transmitted is determined to satisfy the following equations by taking into account the peak current (Ipeak2) of load RTD(111) and peak current(Ipeak1) of driver RTD(112).

$$Ipeak1 < Ipeak2$$

$$Ipeak1 + Iee > Ipeak2$$

$$Iee < Ipeak2 \quad \text{[Equation 1]}$$

Hereinafter, the operational principle on a non-inverted return-to-zero D flip-flop using CML gate and MOBILE circuit configuration is described as follows.

At first, input driving circuit configured with CML gate is described.

Figure 7:
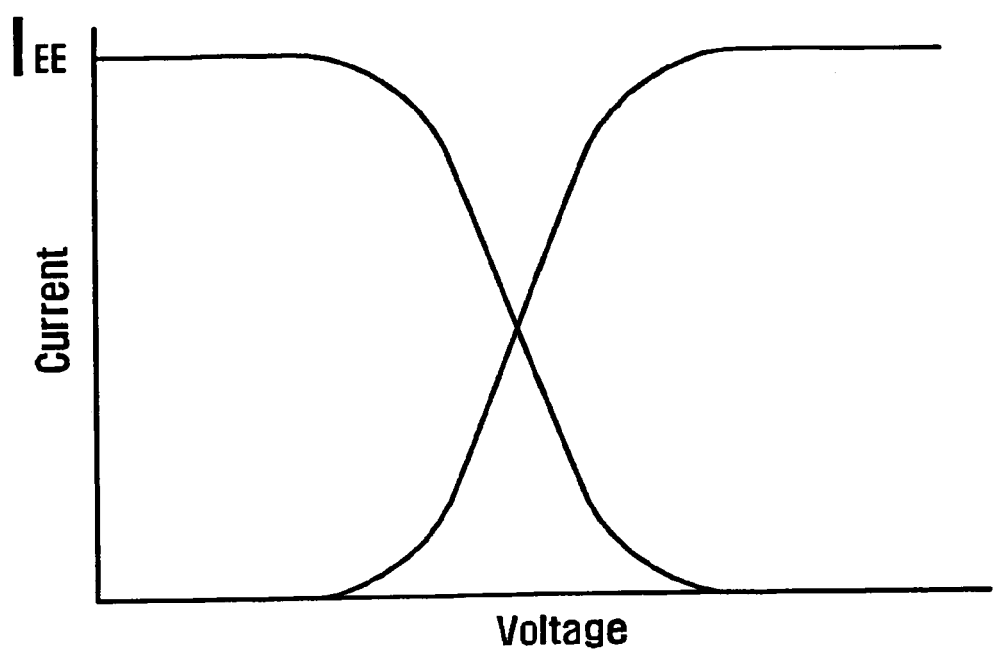
FIG. 7 is a current characteristics in accordance with input voltage of CML gate.

FIG. 7 is a current characteristics in accordance with input voltage of CML gate. When input voltage level is in logic 'LOW' that is more than 0.2 V less than reference voltage, the current doses not transmit to collector of HBT(113) among CML gates, and then the current becomes to be increased according to the increment of input voltage.

Above the logic 'HIGH' state that input voltage is more than 0.2 V larger than reference voltage(Vref), the current flowing to HBT(113) is constantly maintained with current Iee of current source. On the other hand, in collector of HBT(114) in which reference voltage is supplied to base, the current is flowed with the same amount as Iee, and then the larger is the amount of input voltage, the smaller is the amount of current, and finally if input voltage is more than some amount, the current does not flows. It is the principle that the sum of the current flows at HBT 113 and 114 is constantly the same amount as that of current source Iee, and the current is switched according to the relations of magnitude between input voltage and reference voltage(Vref), and then the current is transmitted through 113 or 114.

In the above explanation, it is characterized in that while input voltage gets larger, the current flows at a transistor is constantly the same as Iee, and the current is switched according to the amount of input voltage compared to reference voltage(Vref) regardless of turn-on voltage of a transistor. The amount of current being switched is decided as current source Iee without accurate adjustment of input voltage. Owing to these characteristics, since it is enough that the input voltage that is 0.2 V higher or lower than reference voltage(Vref) is supplied without accurate adjustment, the difficulty of the input voltage adjustment which was a disadvantage of existing MOBILE can be resolved.

Moreover, since HBTs(113, 114) of CML gate operate in an active regime, HBT's have the advantage of fast switching.

Figure 8A:
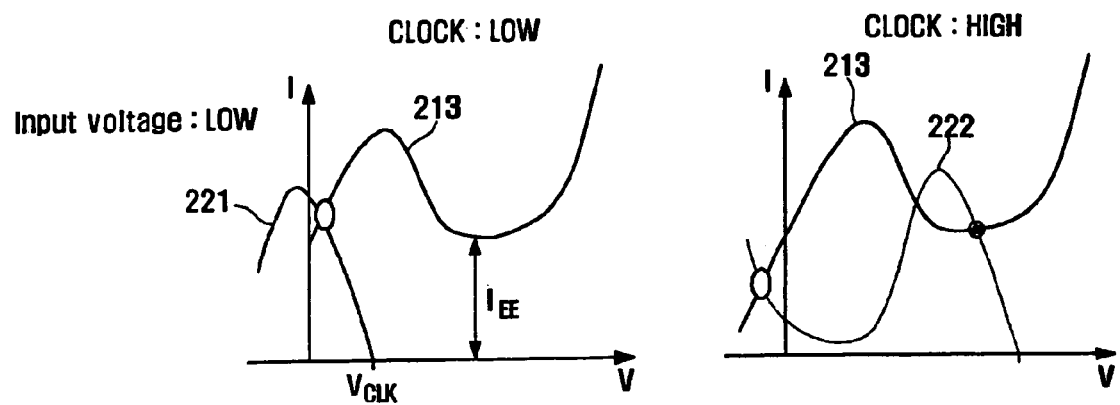
FIGS. 8a and 8b are views illustrating operational principle of Tunneling Diode Logic IC using newly proposed CML-type input driving circuit configuration and MOnostable Bistable Transition Logic Element(MOBILE)
Figure 8B:
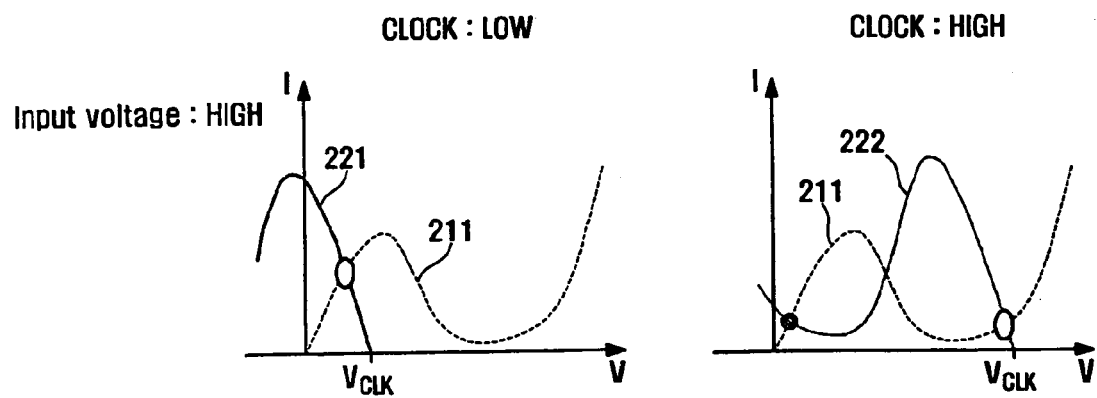

In FIG. 8, the operations of MOBILE using CML input driving circuit are explained. When clock voltage is in 'LOW' state, the stable point is in a single logic 'LOW'. When clock voltage changes to 'HIGH' state that is two times more than peak voltage(VP) of RTD, there are two stable points, 'LOW' and 'HIGH'. The change of output voltage can be decided by the amount of current headed out to input port. That is, when input voltage is in logic 'LOW', the current Iee flows in HBT(114) in which output port and collector are connected, and does not flow in HBT(113) in which output port and collector are not connected. As a result, since load RTD(111) peak current is less than the sum of driver RTD(112) peak current and the collector current of HBT(114), output voltage moves to logic 'LOW' when clock voltage changes to 'HIGH'. On the contrary, when input voltage is in logic 'HIGH', current does not flow in HBT(114) in which output port(133) is connected to collector, and the current Iee flows to HBT(113) that is not connected to output port. As a result, since load RTD(111) peak current is more than the sum of driver RTD(112) peak current and collector current flows at HBT(114), output voltage moves to logic 'HIGH' when clock changes to 'HIGH'. The state change of output voltage is only performed when clock voltage is changed from logic 'LOW' to logic 'HIGH', or when clock voltage is changed from logic 'HIGH' to logic 'LOW'. When clock voltage is not changed, output voltage is not changed even though input voltage is changed. That is, when clock voltage is changed from 'LOW' state to 'HIGH' state, if input voltage is in logic 'HIGH', output voltage is also changed to logic 'HIGH'; when input is in logic 'LOW', output voltage is maintained in logic 'LOW'. When clock voltage is changed from 'HIGH' to 'LOW', non-inverted return-to-zero D flip-flop operation that output voltage is always in logic 'LOW' is performed.

Figure 9:
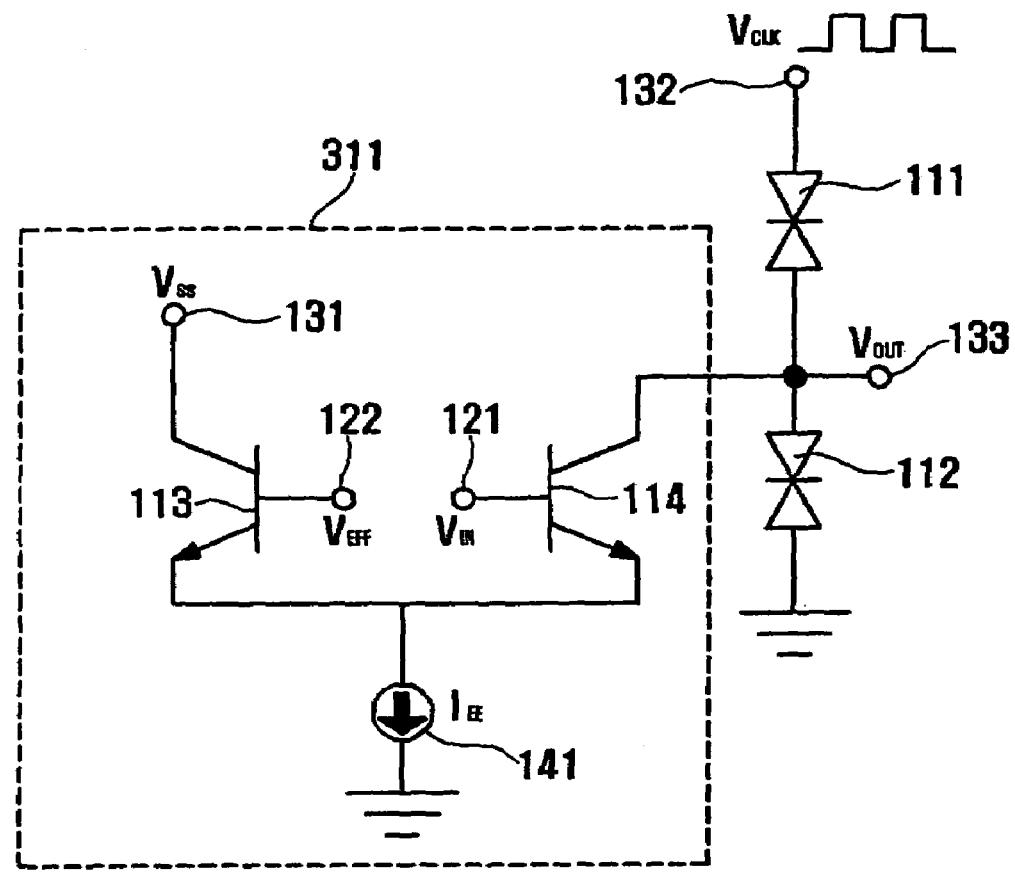
FIG. 9 is a circuit configuration diagram for an inverted return-to-zero D flip-flop configured with RTD logic gate using CML-type input driving circuit configuration and MOBILE proposed in the present invention.

In FIG. 9, the circuit performs inverted return-to-zero D flip-flop operation, where the positions of input port and output port are exchanged in non-inverted return-to-zero D flip-flop configuration. The operational principle is as follows. As Iee flows to HBT(114) that is connected to output port when input voltage is in logic 'HIGH', and Iee flows to HBT(113) that is not connected to output port when input voltage is in logic 'LOW', output becomes logic 'LOW' when input is in logic 'HIGH', and output becomes logic 'HIGH' when input is logic 'LOW'. Thus, the circuit performs inverted return-to-zero D flip-flop operation.

Figure 10:
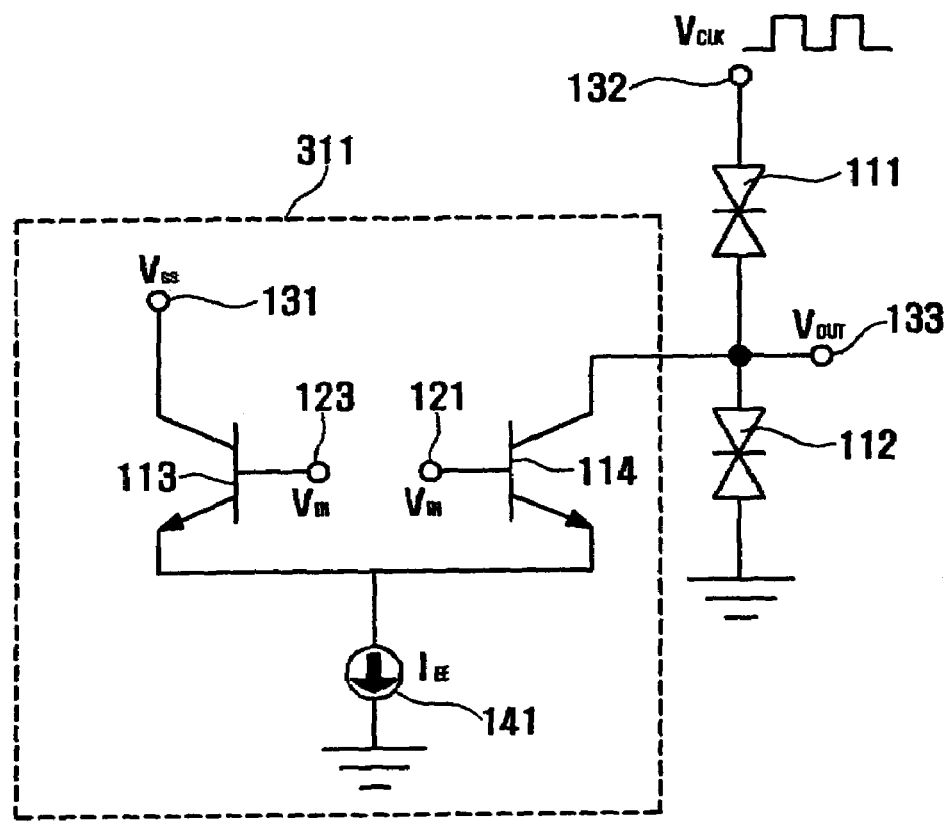
FIG. 10 is a circuit configuration diagram for an inverted return-to-zero D flip-flop receiving two differential signals as input signals, which is configured with RTD logic gate using CML-type input driving circuit configuration and MOBILE proposed in the present invention.

FIG. 10 shows a MOBILE configuration in which differential voltage signal instead of reference voltage(Vref) is supplied. Because logic output of existing CML, ECL, etc. can be an input to MOBILE, this configuration increases the compatibility between MOBILE(tunneling diode based logic circuit) and conventional logics(ECL, CML, SCFL, etc.).

Figure 11:
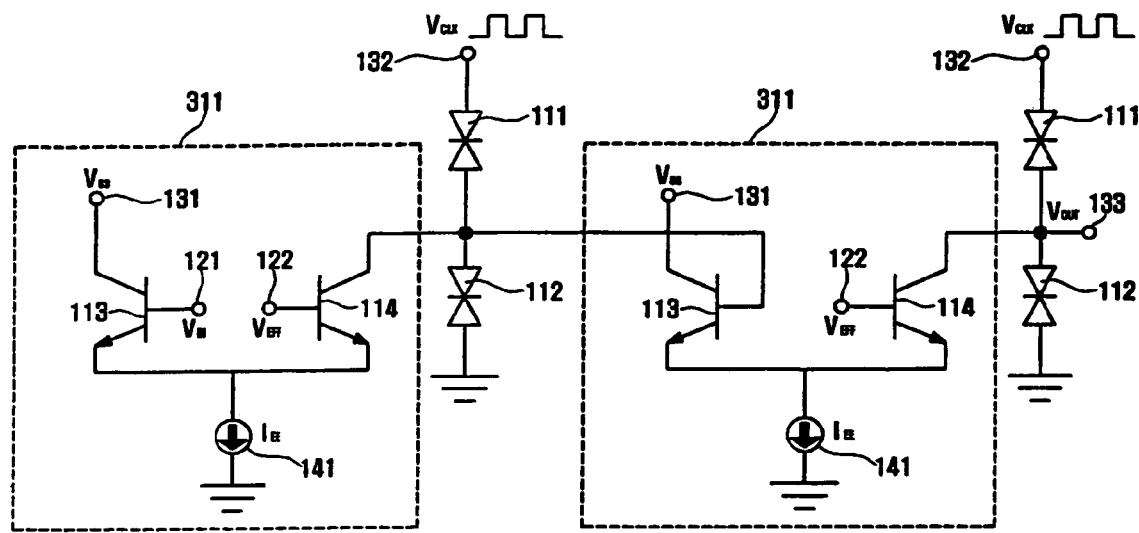
FIG. 11 is a circuit configuration diagram interconnecting two stages of tunneling logic gates.

FIG. 11 shows the configuration that return-to-zero D flip-flop is connected in cascades. At this time, output voltage is delivered to the next stage according to the order by supplying the clock voltage of the second stage with delay compared to that of the first stage, and then output voltage is delivered to the next stage. If reference voltage is decided to the medium value of output voltage, the output of MOBILE can be connected to the input of next stage without additional devices.

Figure 12A:
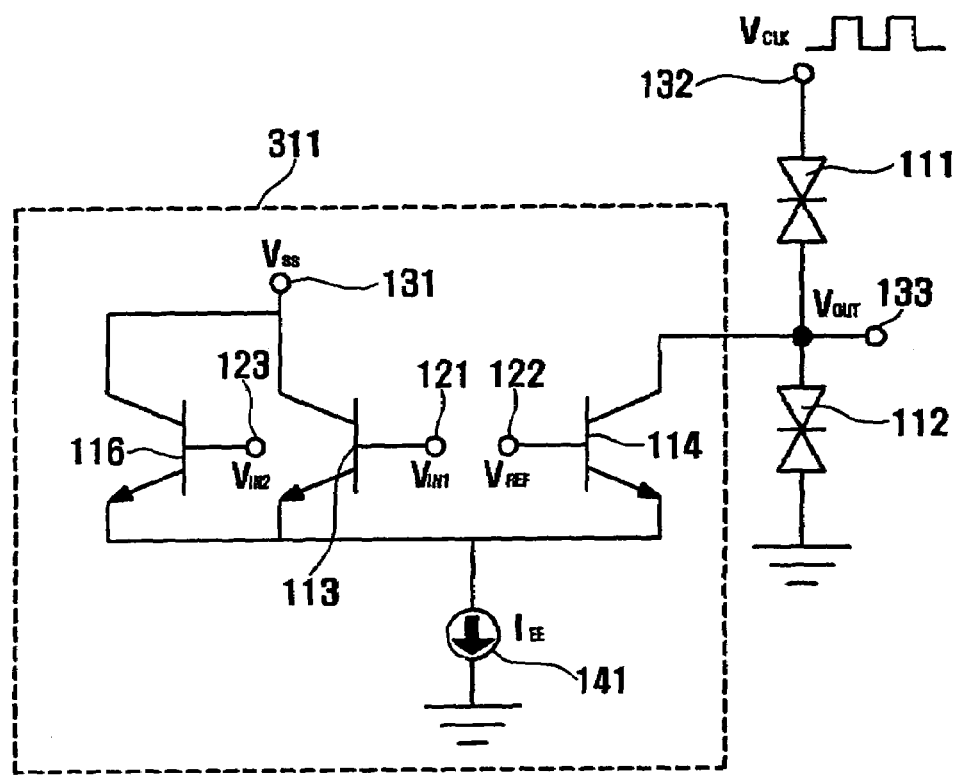
FIGS. 12a and 12b are circuit configuration diagrams for return-to-zero OR gate/return-to-zero NOR gate configured with RTD logic gate using CML-type input driving circuit configuration and MOBILE proposed in the present invention.

FIG. 12a shows an OR gate circuit configuration using CML gate. In the basic return-to-zero D flip-flop configuration, a transistor(116) is connected in a parallel to a transistor (113) that is not connected to output port, where collector and emitter are commonly used. In this configuration, input ports can be two(121 and 123). If more than one among voltages supplied to input ports 121,123 gets larger than reference voltage(Vref, a transistor 114 turns off, thereby the current becomes not to flow.

Moreover, when the voltages of both input ports 121 and 123 are less than reference voltage(Vref), the current Iee flows to a transistor 114. The output voltage is decided by the difference between the sum of the current flows at the transistor connected to output and driver RTD(112) peak current, and load RTD(111) peak current. Since in this case, if is only one voltage among the voltages of input ports becomes logic 'HIGH', there is no current flows at a transistor 114, output voltage is decided to logic 'HIGH'. When voltage supplied to input port is all logic 'LOW', the current Iee flows to a transistor 114, thus, output voltage becomes logic 'LOW'. That is, this circuit operates as a return-to-zero OR gate.

Figure 12B:
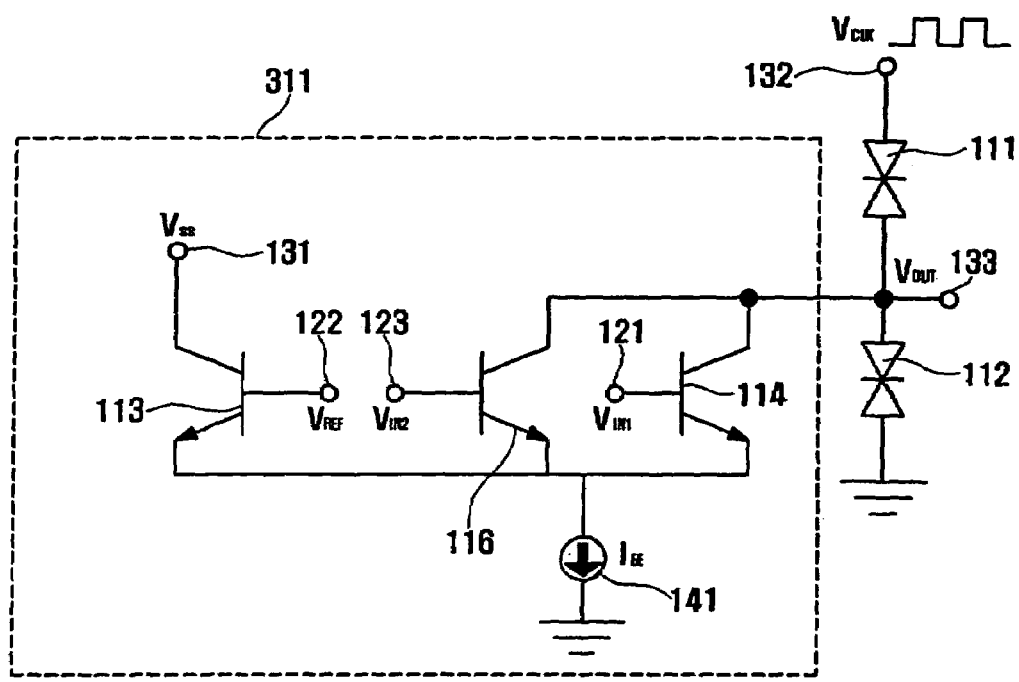

FIG. 12b shows the configuration of return-to-zero NOR gate. It can be implemented by changing the position of a transistor(116) added in return-to-zero OR gate to be connected with output port(133) and by connecting input ports 123 and 121 to the bases of transistors 116 and 114 and connecting reference voltage port(122) to the base of transistor 113. If more than one voltage among the voltages of input ports 121 and 123 is higher than Vref, transistor 114 or 116 turns on, and thereby current Iee becomes to flow. If both of the voltages in input ports 121 and 123 are lower than Vref, transistors 114 and 116 turn off, and thereby current does not flow. The output voltage is decided by the difference between the sum of the current flows at the transistor connected to output port and driver RTD(112) peak current, and load RTD (111) peak current. In this case, if only one voltage among the voltages of input ports becomes logic 'HIGH' state, output voltage becomes logic 'LOW'. When the voltage supplied to two input ports is all in logic 'LOW', output voltage becomes logic 'HIGH'. That is, this circuit operates as a return-to-zero NOR gate.

Figure 13:
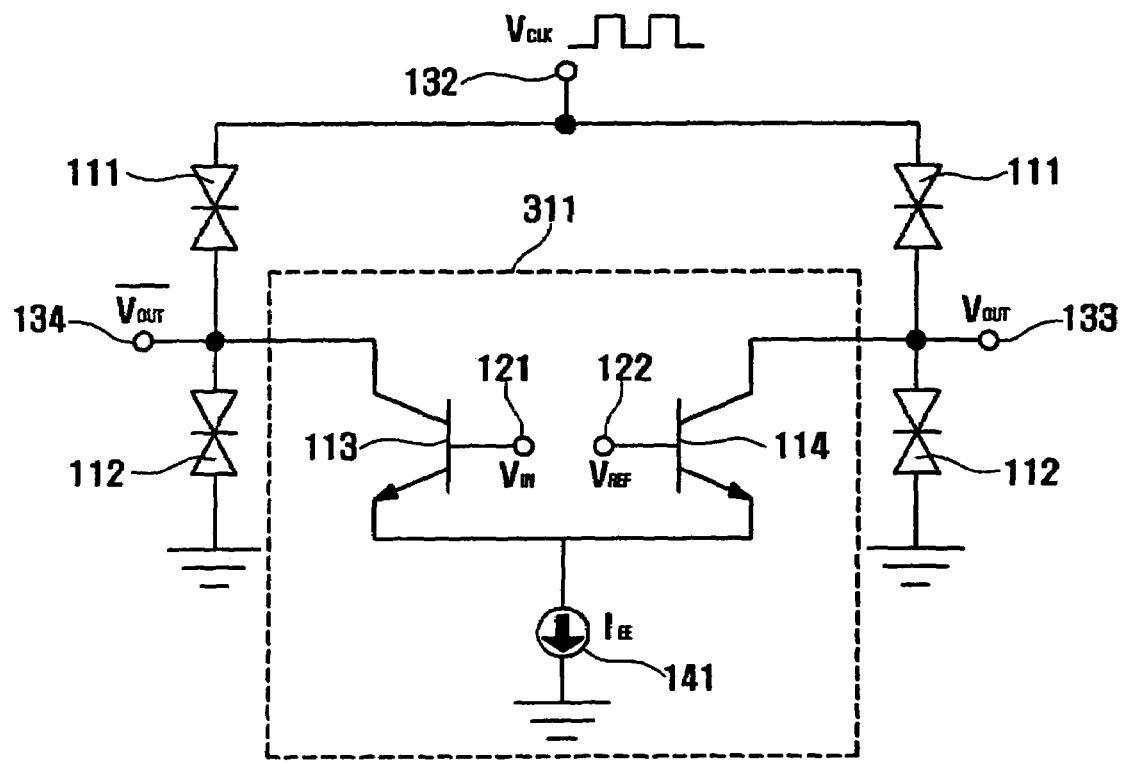
FIG. 13 is a circuit configuration diagram for a differential output voltage return-to-zero D flip-flop generating both non-inverted and inverted outputs simultaneously using CML-type input driving circuit configuration and MOBILE proposed in the present invention.

FIG. 13 shows a type of circuit generating non-inverted output voltage(133) and inverted output voltage(134) for the same input voltage, by connecting MOBILE configuration which is the same configuration as tunneling diode 111 and 112 to a transistor 113 shown in FIG. 6. When higher logic 'HIGH' than reference voltage(Vref) is supplied to input voltage(Vin), the current transmitted through a transistor 113 becomes Iee, and the current transmitted through transistor 114 becomes 0, and thereby inverted output voltage ($\overline{V_{OUT}}$) becomes logic 'LOW' and output voltage(Vout) becomes logic 'HIGH' like the operation of return-to-zero D flip-lop explained in the above. On the contrary, if logic 'LOW' which is lower than reference voltage(vref) is supplied to input voltage(Vin), inverted output voltage becomes logic 'HIGH' and output voltage(Vout) becomes logic 'LOW', which are opposite to the above described case that input voltage(Vin) is higher than reference voltage(Vref). This operation is performed from the circuit configuration in which simultaneous differentiated two outputs can be obtained with a single input signal. The circuit can be compatible with existing conventional ECL, SCFL, and CML-type circuit configurations, and is the circuit capable of tremendously reducing the circuit complexity.

Figure 14:
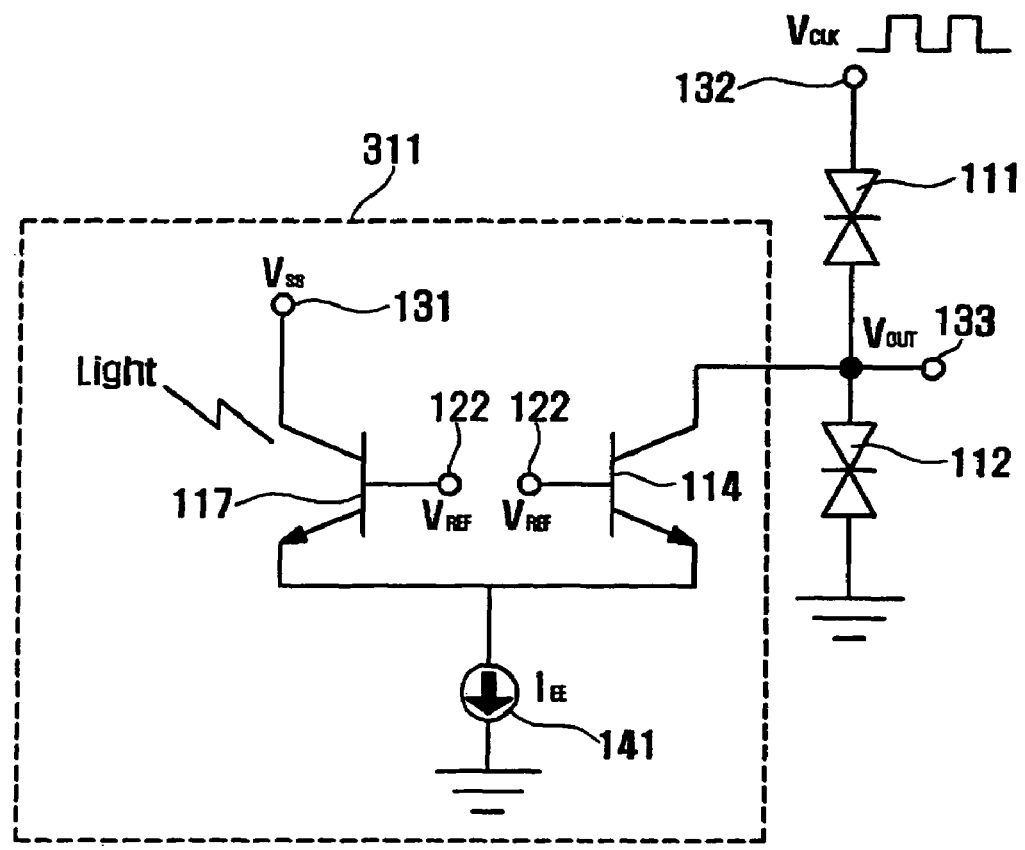
FIG. 14 is a circuit configuration diagram for an optical return-to-zero D flip-flop using photo transistor in a CML input driving circuit.

FIG. 14 shows a configuration replacing a transistor 115 shown in FIG. 6 with a photo transistor(117). According to the intensity of incidence light to photo transistor(117), the amount of current is switched. When the intensity of incidence light to photo transistor(117) is large enough to switch the current Iee, the current does not flow to transistor(114). When the light is not supplied to photo transistor(117), the current Iee flows to transistor(114). As the same principle as the previously explained non-inverted return-to-zero D flip-lop, this circuit operates as optical non-inverted return-to-zero D flip-flop. Wherein, when optical signal is injected, output voltage becomes logic 'HIGH'. With the same principle as the above, by replacing input transistor of the previously explained inverted D flip-flop, return-to-zero OR gate, and return-to-zero NOR with photo transistor(117), optical inverted D flip-flop, optical return-to-zero OR gate, and optical return-to-zero NOR gate can be configured.

Since those having ordinary knowledge and skill in the art of the present invention will recognize additional modifications and applications within the scope thereof, the present invention is not limited to the embodiments and drawings described above.

INDUSTRIAL APPLICABILITY

The present invention relates to high-speed logic gate used to high-speed communications(optical, wired and wireless).

Recently, with the rapid increment of the demand for wideband communication services, high-speed communications capable of delivering more diverse and greater amount of information in a short time are required, thereby it is essential to develop high-speed digital ICs.

Thus, the invention presents CML(Current Mode Logic)-type input driving method and tunneling diode logic using MOBILE(Monostable Nistable transition Logic Element) configuration, as kinds of very high-speed digital logic circuits.

The present invention replaces input port in existing MOBILE circuit using a tunneling diode device having negative resistance characteristics with CML input gate, increases input voltage range by constantly maintaining current even for excessive input voltage, makes transistor be under the bias condition that transistor operates at high-speed by applying enough voltage in collector-emitter(drain-source) of transistor, and provides a plurality of logic gates(inverted D flip-flop, non-inverted D flip-flop, NOR gate, OR gate, optical flip-lop) by replacing input ports with CML gate and adding input transistor.

The invention claimed is:

1. A logic circuit comprising:
   a current mode logic gate having an input port, an output port, and a bias port;
   a tunneling diode pair that is connected to the output port;
   a constant current source coupled to said bias port and supplying a determined constant current to said current mode logic gate wherein the value of said constant current is established to maintain determined relationships between peak currents through each one of said tunneling diode pair and between those peak currents and said constant current;
   wherein said tunneling diode pair comprises a load tunneling diode that is connected to a clock port and a driver tunneling diode that is connected to said load tunneling diode; and
   wherein said logic circuit operates as monostable bistable transition logic element.

2. The logic circuit of claim 1 wherein said logic circuit is configured to be operated in an active (saturation for FET) regime.

3. The logic circuit of claim 1 wherein said logic circuit functions as either a non-inverted return-to-zero D flip-flop or an inverted return-to-zero D flip-flop operation according to the position of the respective input ports.

4. The logic circuit of claim 1 wherein said logic circuit determines the medium value of the output voltage range, logic 'LOW' state value of the output voltage is less than or equal to a logic 'LOW' state value of the input voltage, a logic 'HIGH' state value of the output voltage is greater than or equal to a logic 'HIGH' state value of the input voltage, and thereby the output of the first stage circuit of two interconnected stages of the tunneling logic gates can be supplied to the input of the next stage circuit of two interconnected stages of the tunneling logic gates.

5. The logic circuit of claim 1 wherein return-to-zero NOR/OR operations are performed using parallel input transistors.

6. The logic circuit of claim 1 wherein said diode pair is series connected to the current mode logic gate having two transistors including one coupled to a bias port and the other coupled to the reference voltage port which produces the differential voltage output based on a single input signal.

7. The logic circuit of claim 1 wherein said logic circuit comprises:
   a reference voltage port that is connected to a transistor;
   an input port that is coupled to another transistor which is connected to a bias port; and
   a current source that is coupled between the two transistors under the bias condition.

8. The logic circuit of claim 1 wherein said tunneling diode pair includes a load resonant tunneling diode and driver resonant tunneling diode, wherein said constant current source that satisfies the following equations by taking into account the constant current (Iee), the peak current of said load resonant tunneling diode (Ipeak1) and the peak current of said driver resonant tunneling diode (Ipeak2):

$$I_{peak1} < I_{peak2}$$

$$I_{peak1} + I_{ee} > I_{peak2}$$

$$I_{ee} < I_{peak2}.$$

9. The logic circuit of one of claims 2, 3, 5, 6, and 1, wherein said logic circuit configures either one of optical non-inverted return-to-zero D flip-flop, optical inverted return-to-zero D flip-flop, optical return-to-zero OR gate, or optical return-to-zero NOR gate operations, wherein said diode pair is series connected to the current mode logic gate having two transistors including a photo transistor functions as an input transistor coupled to a bias port and said transistor coupled to the reference voltage port which produces the differential voltage output based on an optical input signal.

* * * * *